United States Patent
Hshieh et al.

[11] Patent Number: 5,904,525
[45] Date of Patent: *May 18, 1999

[54] FABRICATION OF HIGH-DENSITY TRENCH DMOS USING SIDEWALL SPACERS

[75] Inventors: Fwu-Iuan Hshieh, Saratoga; Yueh-Se Ho, Sunnyvale; Bosco Lan, Fremont; Jowei Dun, San Jose, all of Calif.

[73] Assignee: Siliconix incorporated, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/646,593

[22] Filed: May 8, 1996

[51] Int. Cl.[6] ............ H01L 21/336; H01L 21/3205; H01L 21/4763

[52] U.S. Cl. ............ 438/272; 438/589; 438/527; 148/DIG. 126

[58] Field of Search ............ 438/268, 270, 438/272, 589, FOR 176, FOR 192, 527; 148/DIG. 126

[56] References Cited

U.S. PATENT DOCUMENTS

| | | | |
|---|---|---|---|
| 4,791,462 | 12/1988 | Blanchard et al. | 357/23.4 |
| 4,929,991 | 5/1990 | Blanchard | 357/23.8 |
| 4,967,245 | 10/1990 | Cogan et al. | 357/23.4 |
| 5,072,266 | 12/1991 | Bulucea et al. | 357/23.4 |
| 5,086,007 | 2/1992 | Ueno | 437/41 |
| 5,155,052 | 10/1992 | Davies | 438/268 |
| 5,298,442 | 3/1994 | Bulucea et al. | 438/270 |
| 5,341,011 | 8/1994 | Hshieh et al. | 257/330 |
| 5,342,797 | 8/1994 | Sapp et al. | 438/268 |
| 5,374,571 | 12/1994 | Mukherjee et al. | 438/268 |
| 5,468,982 | 11/1995 | Hshieh et al. | 257/331 |
| 5,558,313 | 9/1996 | Hshieh et al. | 257/342 |
| 5,668,026 | 9/1997 | Lin et al. | 438/272 |

Primary Examiner—Richard A. Booth
Attorney, Agent, or Firm—Skjerven, Morrill, MacPherson, Franklin & Friel LLP; Norman R. Klivans

[57] ABSTRACT

A method for forming a trenched DMOS transistor with deep body regions that occupy minimal area on an epitaxial layer formed on a semiconductor substrate. A first oxide layer is formed over the epitaxial layer and patterned to define deep-body areas beneath which the deep body regions are to be formed. Next, diffusion-inhibiting regions of the first conductivity type are formed in each of the deep-body areas before forming a second oxide layer covering the deep-body areas and the remaining portion of the first oxide layer. Portions of the second oxide layer are then removed to expose the centers of the diffusion inhibiting regions, leaving the first oxide layer and oxide sidewall spacers from the second oxide layer to cover the peripheries of the diffusion-inhibiting regions. A deep-body diffusion of a second conductivity type is then performed, resulting in the formation of deep body regions in the epitaxial layer between the sidewall spacers. The peripheries of the diffusion-inhibiting regions covered by the remaining portions of the first and second oxide layers inhibit lateral diffusion of the deep body diffusions without significantly inhibiting diffusion depth.

37 Claims, 9 Drawing Sheets

FABRICATION OF HIGH-DENSITY TRENCH DMOS USING SIDEWALL SPACERS

CROSS REFERENCE TO RELATED APPLICATIONS

The assignee of the present application owns copending and related patent applications:

1. Ser. No. 08/253,527 now U.S. Pat. No. 5,468,982 filed Jun. 3, 1994, entitled "Trenched DMOS Transistor With Channel Block at Cell Trench Corners," which has been allowed;
2. Ser. No. 08/290,323, now abandoned entitled "Trenched DMOS Transistor Fabrication Using Seven Masks and Having Thick Termination Oxide";
3. Ser. No. 07/918,996 now U.S. Pat. No. 5,430,324 entitled "High Voltage Transistor Having Edge Termination"; and
4. Ser. No. 08/096,135 now U.S. Pat. No. 5,404,040 entitled "Structure and Fabrication of Power MOSFETS, Including Termination Structure."

The present application is also related to U.S. Pat. No. 5,304,831, entitled "Low On-Resistance Power MOS Technology," and to U.S. Pat. No. 5,072,266, entitled "Trench DMOS Power Transistor With Field-Shaped Body Profile and Three-Dimensional Geometry." The aforementioned documents are all incorporated herein by this reference.

BACKGROUND

1. Field of the Invention

This invention relates to trenched transistors (both FET and bipolar) and more specifically to a trenched DMOS transistor.

2. Description of Related Technology

Double-diffused MOS (DMOS) transistors are a type of MOSFET in which diffusions form the active transistor regions. It is known to form such transistors in a silicon substrate using a trench lined with a thin oxide layer and filled with conductive polysilicon to form the transistor gate structure. These transistors are typically used for power applications, such as high-current switching applications.

FIG. 1 illustrates a conventional, hexagonally-shaped trench DMOS structure 21. Structure 21 includes an N+ substrate 23, on which is grown a lightly doped epitaxial layer (N) 25 of a predetermined depth $d_{epi}$. Within epitaxial layer 25, a body region 27 of opposite conductivity (P, P+) is provided. Except in a certain central region that will be discussed shortly, the P body region 27 is substantially planar and lies a distance $d_{min}$ below the top surface of epitaxial layer 27. Another covering layer 28 (N+) overlying most of the body region 25 serves as the source of structure 21.

A hexagonally-shaped trench 29 is provided in epitaxial layer 25, opening toward the top and having a predetermined depth $d_{tr}$. Trench 29 is lined with an oxide insulating layer 30 and filled with doped polysilicon. The trench 29 associated with a transistor cell defines a cell region 31 that is also hexagonally shaped in horizontal cross-section. Within cell region 31, the body region rises to the top surface of epitaxial layer 25 and forms an exposed pattern 33 in a horizontal cross section at the top surface of the cell region.

The central exposed portion 33 of the body region is more heavily doped (P+) than the substantially planar remainder of the body region. Further, this central portion of the body region (i.e., deep diffusion region 27C) extends below the surface of epitaxial layer 25 to a depth $d_{max}$ that is greater than the trench depth $d_{tr}$. This is very important because any source-to-drain voltage breakdown is forced away from the trench surfaces (e.g., the portions of gate oxide 30 adjacent body region 27) and into the bulk of N+ substrate 23. Thus, deep diffusion region 27C prevents destructive breakdown of the gate oxide dielectric.

As discussed above, the use of deep diffusion region 27C provides a significant advantage in protecting the gate oxide. Unfortunately, the deeper a diffusion, the greater the extent of that diffusion's lateral encroachment of neighboring structures. Deep diffusions consequently require a large amount of die area, leading to inefficient device packing and increased device cost. Hence, there is a need for a structure that provides the advantages of a trenched DMOS transistor with deep diffusion regions while minimizing the area required to provide deep diffusion regions of sufficient depth.

SUMMARY

The present invention is directed to a trenched DMOS transistor with deep body regions that occupy minimal area on the principal surface of a semi-conductor substrate, and therefore allow for efficient device packing. The present invention is further directed to a method of manufacturing such a transistor.

According to the invention, a semiconductor substrate is provided with an epitaxial layer of a first conductivity type extending from a principal surface of the substrate. A first oxide layer is formed over the epitaxial layer and patterned to define a deep-body area on the epitaxial layer beneath which a deep body region is to be formed.

A diffusion-inhibiting region of the first conductivity type is formed in the deep-body area before forming a second oxide layer covering the deep-body area and the remaining portion of the first oxide layer. Portions of the second oxide layer are then removed to expose the center of the diffusion inhibiting region, leaving the first oxide layer and oxide sidewall spacers from the second oxide layer to cover the periphery of the diffusion-inhibiting region.

Next, a deep-body diffusion of a second conductivity type is performed, resulting in the formation of a deep body region in the epitaxial layer between the sidewall spacers. The periphery of the diffusion-inhibiting region covered by the remaining portions of the first and second oxide layers inhibits the lateral diffusion of the deep body diffusion without significantly inhibiting diffusion depth. Thus, the present invention minimizes the surface area required to provide the deep-body diffusion, consequently minimizing the surface area occupied by the resulting deep body region.

BRIEF DESCRIPTION OF THE FIGURES

FIGS. 3 through 10a and 11 through 16 depict a sequence of steps to form a transistor (shown in cross section) in accordance with the invention; and FIG. 10b depicts a plan view of the processing step shown in FIG. 10a.

DETAILED DESCRIPTION

Figure 1:
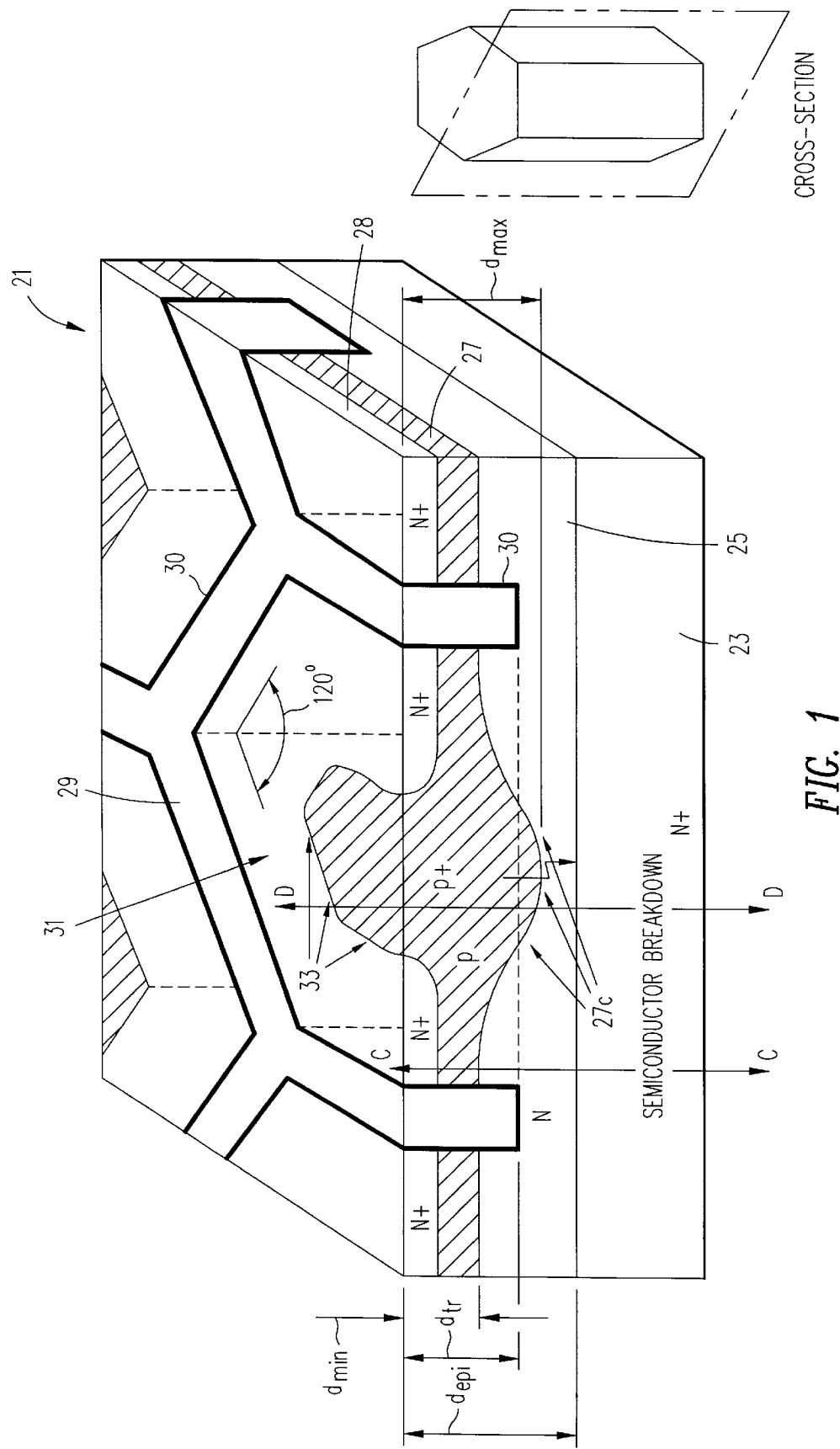
FIG. 1 depicts a conventional, hexagonally-shaped trench DMOS structure 21.
Figure 2:
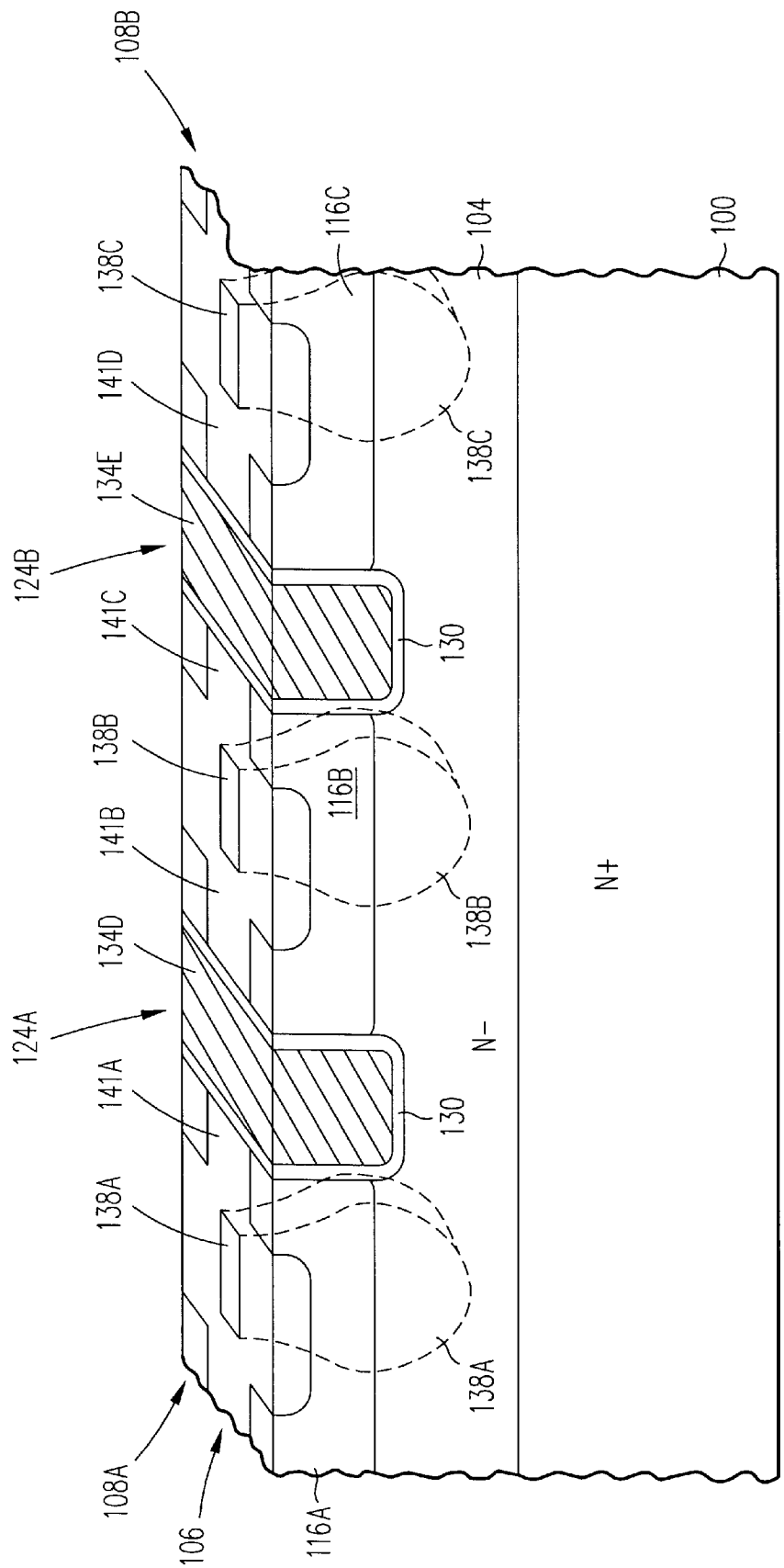
FIG. 2 depicts a perspective view of a portion of a transistor in accordance with the present invention.

FIG. 2 shows a perspective (combined crosssectional and plan) view of a multi-cell DMOS trenched transistor in accordance with the present invention. This view is of a portion of such a transistor, illustrating a few cells thereof. Moreover, only the transistor substrate and the associated doped regions are shown together with the trenches. That is to say, the overlying insulating layers, gate structures, and conductive interconnect are not shown for simplicity; these are illustrated in later figures.

In FIG. 2, formed on the conventional N+ doped substrate 100 is an N- doped epitaxial layer 104. Formed in epitaxial layer 104 are two (exemplary) trenches 124a and 124b that are formed using conventional etching techniques, as described below. Lining each of trenches 124a, 124b is oxide insulating layer 130. Each trench 124a, 124b is filled with a doped polysilicon structure, respectively 134d, 134e. The principal surface of the epitaxial layer 104 is designated 106. Additional trenches intersect trenches 124a, 124b at right angles, thereby defining the intervening cells. The edges of these adjacent intersecting trenches are labelled 108a and 108b.

FIG. 2 illustrates two cells of a transistor that are conventionally electrically interconnected by an overlying interconnect, as described below. The first cell includes trench 124a, a P doped body region 116a, an N+ doped source region 141a, and a P+ doped deep body region 138a. The lower portion of P+ doped deep body region 138a is delineated with a dotted line because P+ doped deep body region 138a is set back within the structure of FIG. 2 so that region 138a is not intersected by the edge 108b of the adjacent intersecting trenches. (The doping levels and depths of these regions are described below in detail.) The second cell includes P doped body region 116b, N+ doped source region 141b, 141c, and P+ doped deep body region 138b. The third cell includes P doped body region 116c, N+ doped source region 141d, and P+ doped deep body region 138c. These N+ doped source regions 141a, 141b, 141c, and 141d comprise a central N+ diffusion-inhibiting region 105 merged with a respective outer N+ source region 140i, as will be explained in more detail below.

The structure shown in FIG. 2 is similar to that of FIG. 2 of copending application "Trenched DMOS Transistor With Channel Block at Cell Trench Corners," except for the shape (both in the plan view and crosssectional view) of the P+ doped deep body regions 138a, 138b, and 138c. According to the present invention, these regions are formed, as described in detail below, to occupy minimal area on the principal surface 106. It is to be understood that the drain electrode for the transistor is conventionally formed on the backside surface (not shown) of the underlying substrate 100.

Figure 3:
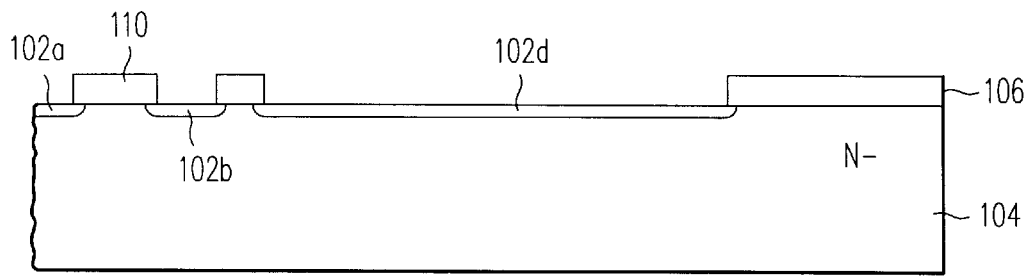

FIG. 3 shows in cross section a first process step to form a trenched DMOS field effect transistor as depicted in FIG. 2. It is to be understood that this process is exemplary and other processes may be used to fabricate the final transistor structure.

A substrate 100 of FIG. 2 (not shown in FIG. 3), which is conventionally N+ doped, has an N- doped epitaxial layer 104 grown on the surface of the substrate. Epitaxial layer 104 is approximately 5 to 10 microns ($10^{-6}$ m) thick.

Principal surface 106 of the epitaxial layer 104 is conventionally oxidized to form a silicon dioxide layer 110 approximately 1 micron thick. Silicon dioxide layer 110 is conventionally patterned using photoresist and a mask to define N+ regions 102a, 102b, and 102d. (Note that FIGS. 3 to 10a and 11 to 16 do not correspond exactly to FIG. 2 because the termination structure is not shown in FIG. 2.)

The N+ implant step is carried out by implanting phosphorus at an energy level of 60 KEV with a dosage of typically $5 \times 10^{15}$ to $1 \times 10^{16}/cm^2$. Then, in FIG. 4, an oxide layer (not shown) is conventionally deposited over the entire principal surface 106. In one embodiment, the oxide layer is silicon dioxide formed using a conventional tetraethylorthosilicate (TEOS) reaction. This oxide layer is then anisotropically etched away, leaving oxide sidewall-spacers 103. Oxide sidewall spacers 103 are preferably from approximately 0.2 to approximately 0.5 microns wide.

Figure 5A:
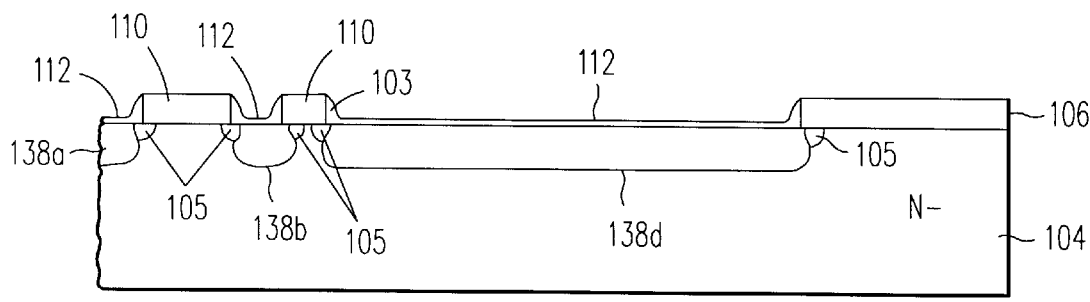

FIG. 5a depicts the results of a P+ implant step carried out by implanting boron at an energy level of 60 KEV with a dosage of $2 \times 10^{15}$ to $1 \times 10^{16}/cm^2$. This, combined with a conventional diffusion step in which the P+ dopants are diffused at 1100° C. for two hours, forms the P+ doped regions 138a, 138b, and 138d. (Region 138d is not a deep body region in function because it is a part of the transistor termination structure.) An oxide layer 112 approximately 0.5 micron (5000 Å) thick is also grown during this diffusion. The final depth of the P+ deep body regions is 1.5 to 3.5 microns.

Figure 4:
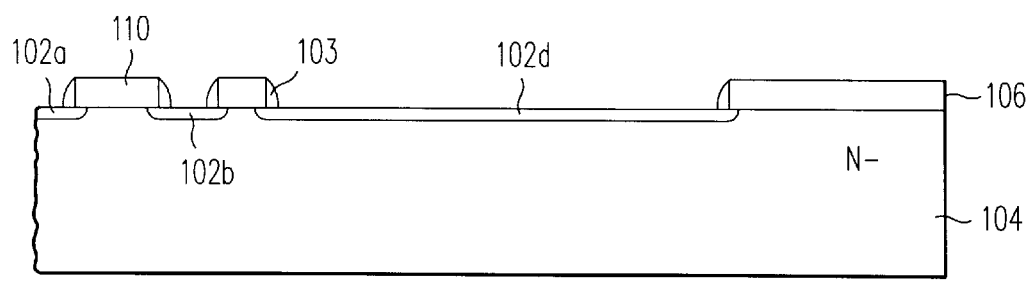

As shown in FIGS. 4 and 5a, the edges of N+ regions 102a, 102b, and 102d are shielded from the preceding boron implant by oxide sidewall spacers 103. As a result of this shielding, portions of N+ regions 102a, 102b, and 102d remain as lateral-diffusion-inhibiting regions 105. Lateral-diffusion-inhibiting regions 105 inhibit the lateral diffusion of P+ doped regions 138a, 138b, and 138d. It is to be understood that the P+ region 138d and all portions of the transistor structure to the right thereof are the termination portion (edge) of an integrated circuit die, the vertical line at the far right being a die scribe line. The termination structure disclosed herein is exemplary and not limiting.

In another embodiment, the effects of lateral-diffusion-inhibiting regions 105 are enhanced by dry etching the exposed N+ regions 102a, 102b, and 102d while forming sidewall spacers 103 in the step illustrated in FIG. 4. In this step, the N+ regions are etched by reactive ion etching (RIE) to a typical depth of approximately 0.1 to 0.3 microns.

Figure 5B:
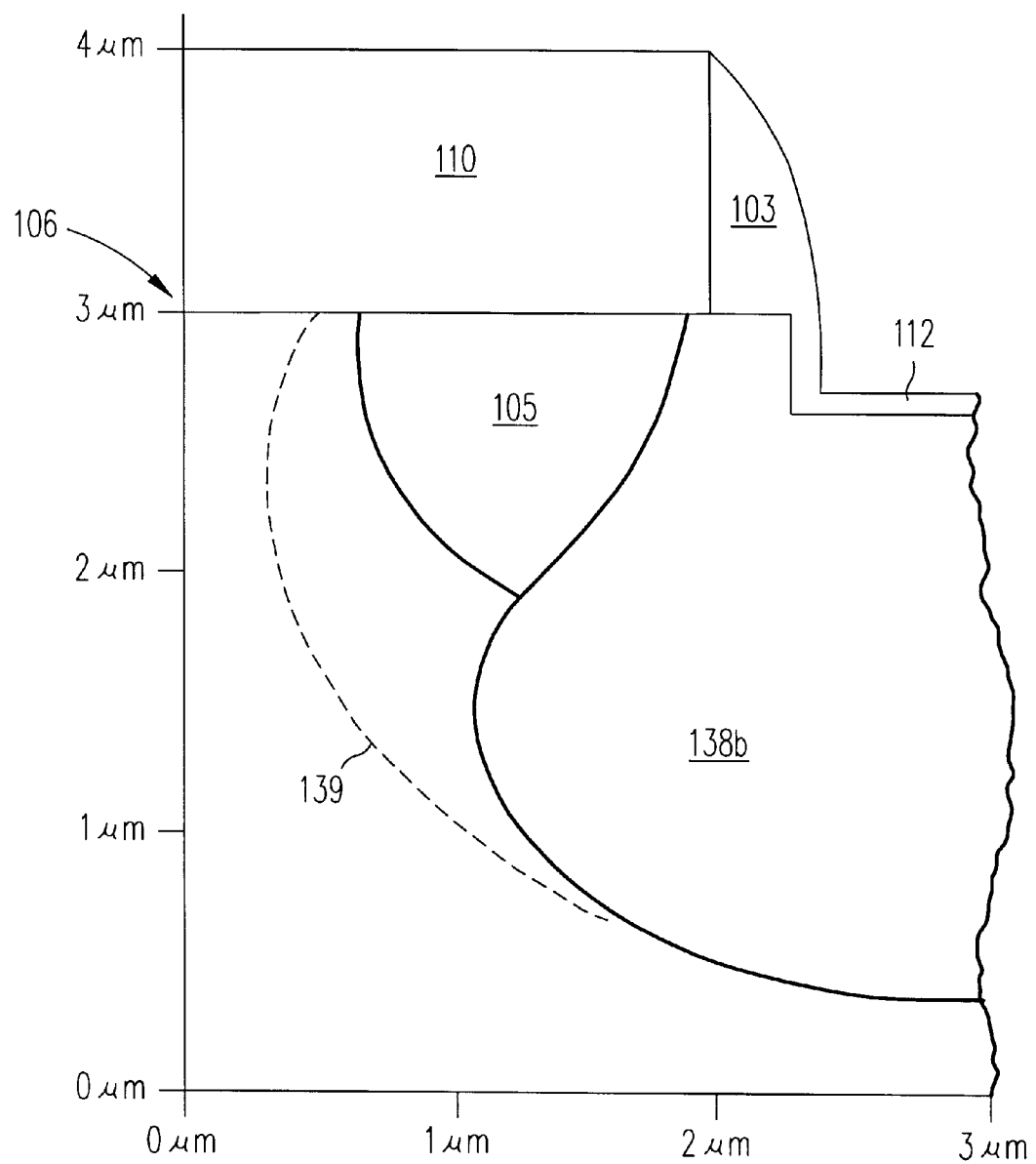

FIG. 5b is an enlarged view of a portion of FIG. 5a and showing a portion of P+ region 138b. The dotted line 139 illustrates the approximate shape of a conventional P+ implant similar to P+ region 138b, but formed without a lateral-diffusion-inhibiting region 105 to restrain the lateral diffusion of P+ region 138b.

Figure 6:
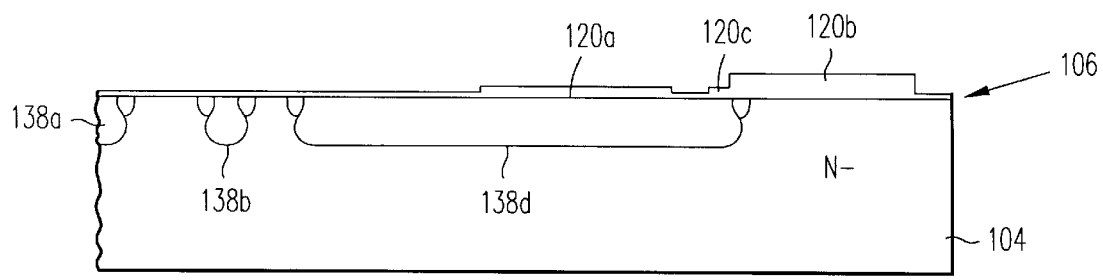

In FIG. 6, an active-region mask layer is formed by covering the principal surface 106 with a photoresist layer that is then conventionally exposed and patterned using a mask to leave the active mask portions 120a, 120b, and 120c.

Figure 7:
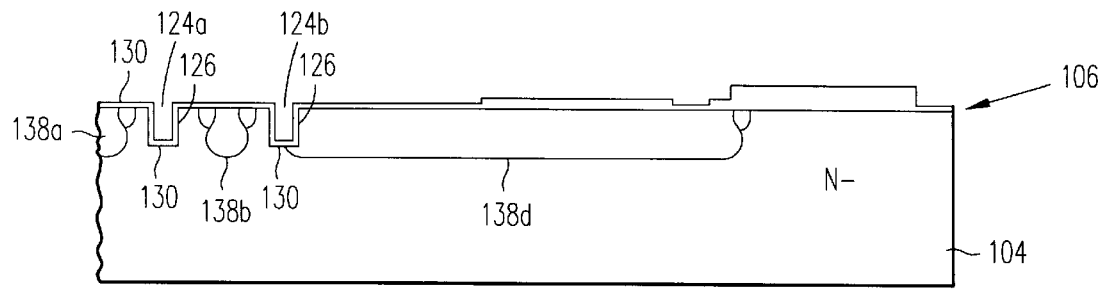

Then, in FIG. 7, first a low-temperature-oxide undoped (LTO) layer (not shown) is deposited over the entire principal surface 106 after a cap oxide layer 300 Å thick (also not shown) is grown to prevent outdiffusion from the LTO layer. This LTO layer, when patterned, is used as an etch mask for defining the locations of the trenches. The LTO layer is then conventionally patterned using photoresist to form openings that define the locations of trenches 124a and 124b, which upon completion are each typically 0.5 to 1.5 microns wide and pitched 5 to 10 microns apart (center-line to center-line). Then, trenches 124a and 124b are dry-etched through the mask openings by reactive ion etching (RIE) to a typical depth of 1.5 microns (a typical range is 0.5 to 10 microns), and the LTO layer is stripped by a buffered oxide etch. Alternately, a conventional photoresist mask is directly applied to define the trench regions without growing the cap oxide or depositing the LTO layer. The process depends on the desired trench depth and trench etch techniques.

Next the sidewalls 126 of each trench 124a, 124b are smoothed, first using a chemical dry etch to remove a thin layer of silicon (approximately 500 Å to 1000 Å thick) from the trench sidewalls 126. This thin removed layer eliminates damage caused by the earlier reactive ion etching. In addition, the etching step rounds off the top and bottom portions of the trenches. A further sacrificial oxidation step then smoothes the trench sidewalls 126. A layer of silicon dioxide (not shown) is conventionally thermally grown on the sidewalls 126 of the trench to a thickness of approximately 200 Å to 2,000 Å. This sacrificial oxide layer is removed either by a buffer oxide etch or by an HF etch to leave the trench sidewalls 126 as smooth as possible.

As shown in FIG. 7, the gate oxide layer 130 is then grown to line the trench sidewalls 126 and extend over the principal surface 106 to a thickness of approximately 100 Å to 1000 Å.

Figure 8A:
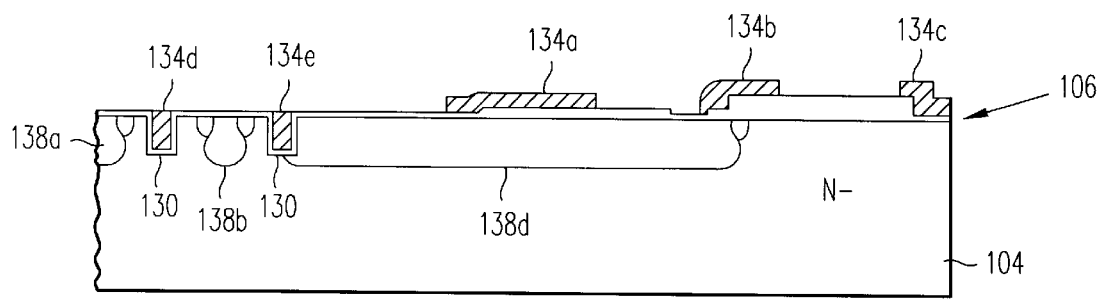

Then, as shown in FIG. 8a, a layer of polycrystalline silicon (polysilicon) is deposited to a thickness of e.g. approximately 1.5 microns (a typical range is 0.5 to 1.5 microns), filling trenches 124a, 124b. Next, planarization of the polysilicon layer is followed by a blanket etch to optimize the polysilicon thickness and to leave only a thickness of 0.5 micron (5,000 Å). Thus, a 1 micron thickness (10,000 Å) of polysilicon is removed by this uniform etching.

Then the polycrystalline silicon layer (for an N-channel transistor) is doped with phosphorus chloride ($POCl_3$) or implanted with arsenic or phosphorous to a resistivity of approximately 15 to 30 ohms per square. The polycrystalline silicon layer then is patterned to form the structures 134a, 134b, 134c and also gate electrodes 134d, 134e. This patterning uses a photoresist layer that is exposed and mask patterned. The polycrystalline silicon structures 134a, 134b, 134c in the right-hand portion of FIG. 8a are a part of the gate contact and termination portions of the transistor. For example, silicon structure 134c is a portion of an equipotential ring that, after scribing, is shorted to the substrate 104.

Figure 8B:
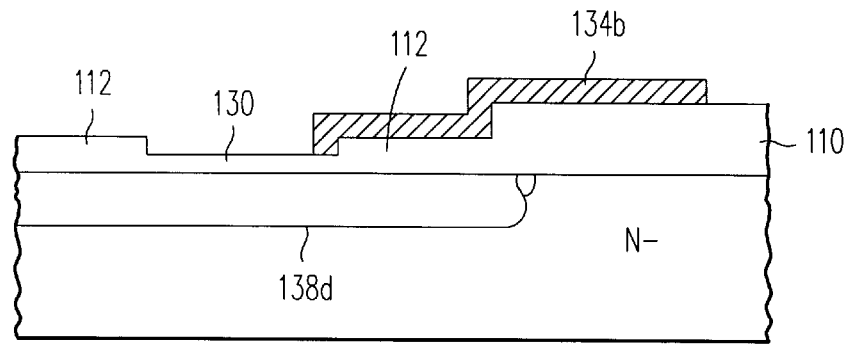

FIG. 8b is an enlarged view of the portion of FIG. 8a at the area of polysilicon structure 134b, illustrating the step-like configuration of polysilicon structure 134b due to the three underlying thicknesses of oxide, respectively oxide layers 130, 112, and 110. This step-like configuration, although only shown in FIGS. 8b and 11b, is present also in the structures of FIGS. 9 to 16.

Figure 9:
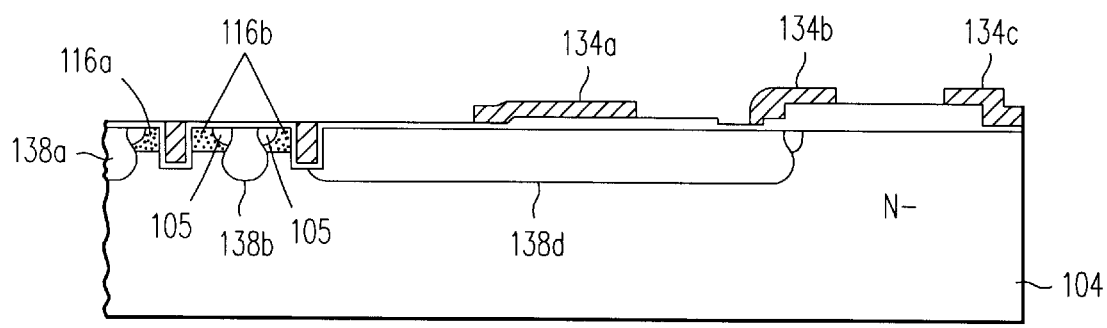

Next, in FIG. 9, the P body regions 116a, 116b are implanted and diffused. There is no body region implant mask so the P body implant 116a, 116b is uniform across the wafer. Instead of a body mask, the previously formed active mask layer 120a, 120b prevents the P body implant from doping the termination region. The P body regions 116a and 116b are boron implanted at 40 to 60 KEV with a dose of $2 \times 10^{13}$ to $2 \times 10^{14}/cm^2$. After diffusion, the depth of the P body regions 116a and 116b is approximately 0.5 to 2.0 microns.

Figure 10A:
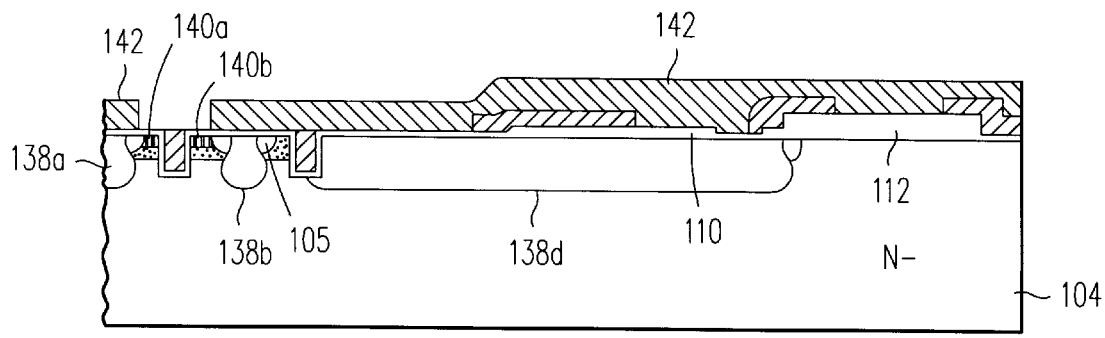

Next, as shown in FIG. 10a, the N+ doped source regions 140a and 140b are implanted and diffused using a photoresist masking process involving patterned masking layer 142. The source regions 140a and 140b are an N+ arsenic implant at 80 KEV with a dosage of typically $5 \times 10^{15}$ to $1 \times 10^{16}/cm^2$. It is to be understood that the cross-sectional views in FIGS. 3 through 10a and 11 through 16 are taken through the center of P+ regions 138a, 138b of FIG. 2, and thus do not depict the cutout configuration of N+ source regions 140a and 140b.

Figure 10B:
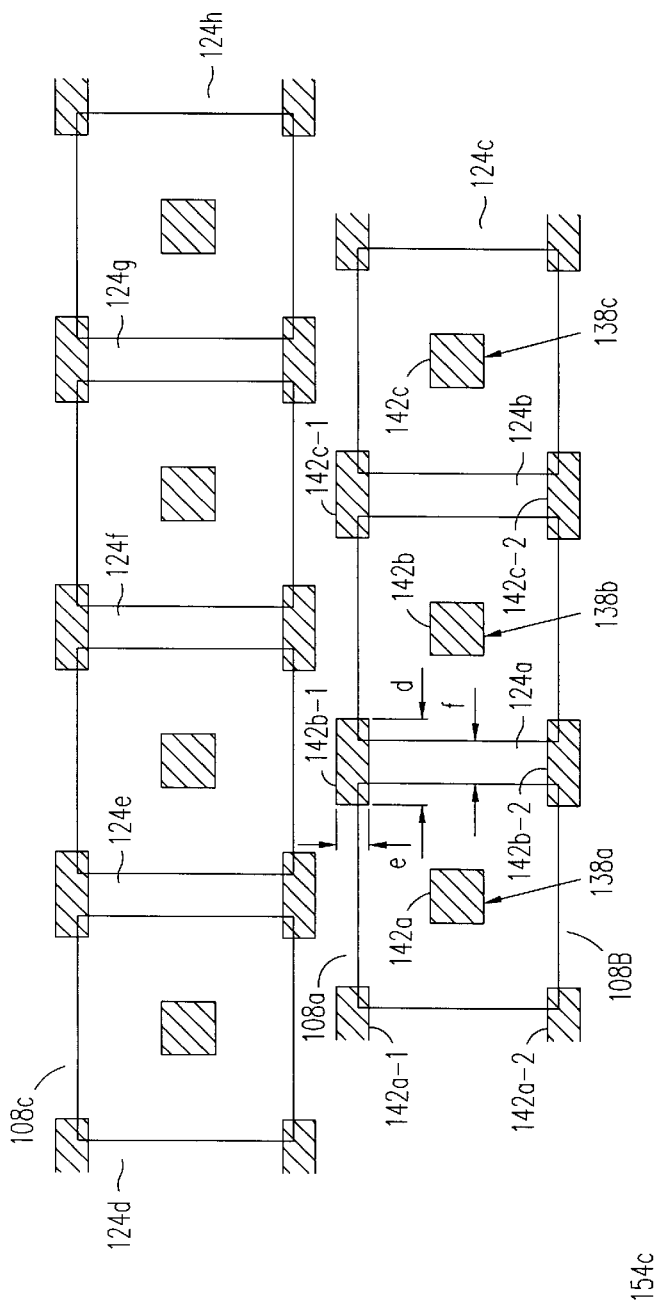
Figure 11:
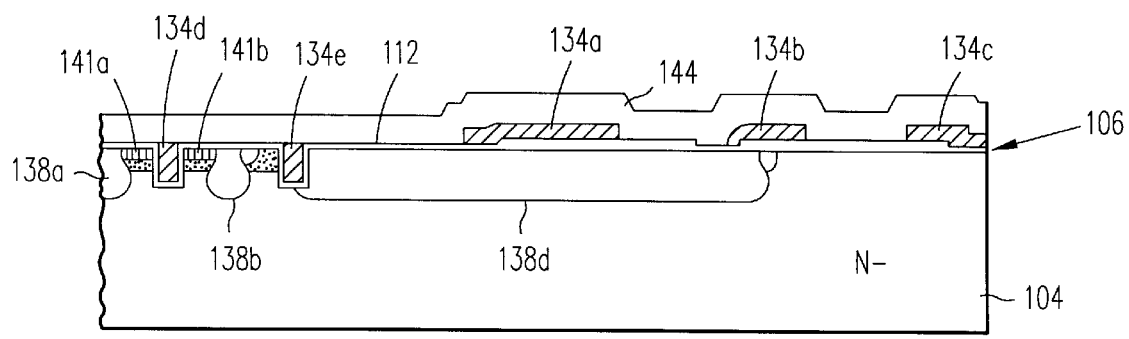

FIG. 10b is a plan view of the step depicted in FIG. 10a but showing additional portions of the structure. In FIG. 10b a number of cells of the transistor are depicted. However, the termination structure depicted in the right-hand portion of FIG. 10a is not shown in FIG. 10b; instead only active cells are depicted, i.e., the left-hand portion of FIG. 10a. Shown in FIG. 10b are the trenches 124a, 124b, and an additional trench 124c, as well as the trenches defining the next row of cells (e.g., trenches 124d, 124e, 124f, 124g and 124h). Also depicted are the intersecting trenches 108a, 108b, as depicted in FIG. 2, and an additional intersecting trench 108c. These trenches define the depicted square cells.

Also, depicted in FIG. 10b is the blocking mask layer 142 in FIG. 10a, which defines the lateral extent of the N+ source regions. This blocking mask layer is shown by the numerous small, cross-hatched rectangular areas in FIG. 10b. The small, rectangular areas in the center of each of the cells (e.g., 142a, 142b, and 142c), define the underlying P+ deep body topside contact regions 138a, 138b, and 138c. The corresponding structure in the upper row of cells in FIG. 10b is not labeled but is similar.

This portion of the structure is essentially conventional. However, the significant portions of blocking mask 142 are the additional rectangular masking layer portions designated (for the first row of cells in FIG. 10b) respectively 142a-1, 142a-2, 142b-1, 142b-2, and 142c-1, 143c-2. These define the N+ region cutouts depicted in the top view in FIG. 2, as can be understood by comparing FIG. 10b to FIG. 2. The dimensions of each small rectangular mask portion, for example, portion 142a-1, are "d" by "e" where e.g. "d" is 3.5 microns and "e" is 1.7 microns. The trenches for the first row of cells are in one embodiment conventionally offset from those in the second row of cells in FIG. 10b, although this is not essential to the invention.

Referring to FIG. 11, mask layer 142 is conventionally stripped and the N+ doped source regions 140a and 140b are diffused to a depth of approximately 0.2 to 0.5 microns at a temperature ranging from approximately 900 to 1000° C. Then, a BPSG (borophosphosilicate glass) layer 144 is conventionally formed to a thickness of approximately 0.5 to 1.5 microns over the entire principal surface 106 and over the polysilicon structures 134a, 134b, 134c, 134d, and 134e. BPSG layer 144 is covered with a photoresist layer (not shown) that is patterned after exposure. Then the underlying BPSG layer 144 and oxide layer 112 are etched so as to leave the BPSG regions 144a, 144b, 144c, 144d, and 144e, between which are defined the transistor contact areas. N+ doped source regions 140a and 140b are shown to be merged with their respective lateral-diffusion-inhibiting regions 105 to form N+ doped source regions 141a and 141b.

Figure 12:
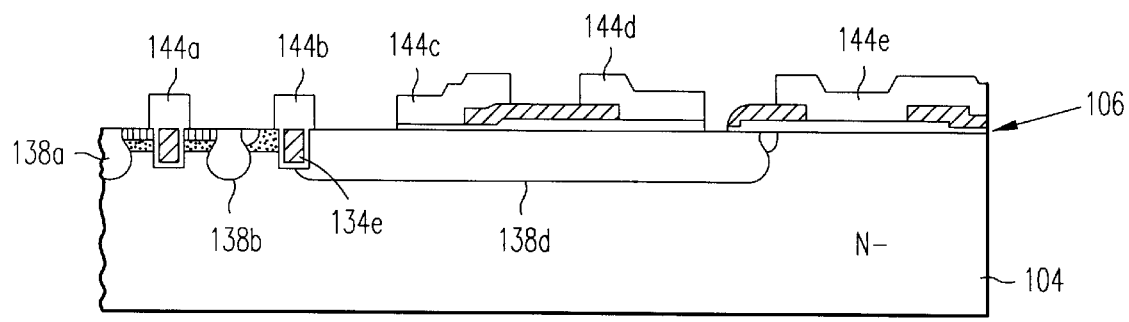

In the step of FIG. 12, a reflow step smoothes the corners on the BPSG layer structures 144a, 144b, 144c, 144d, and 144e.

Figure 13B:
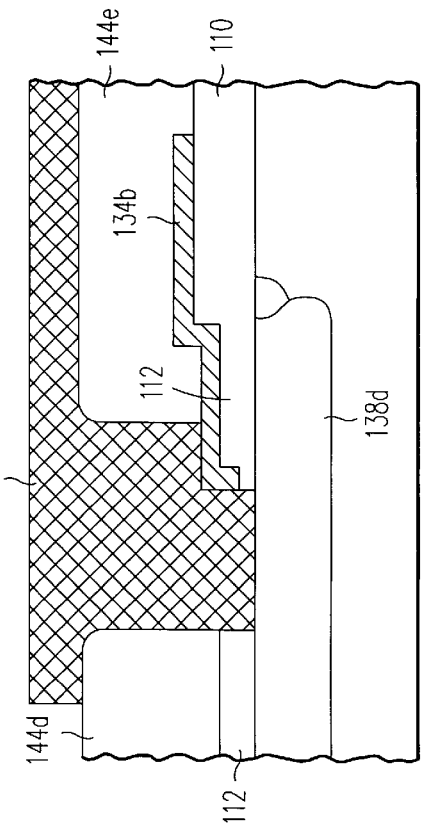
Figure 13A:
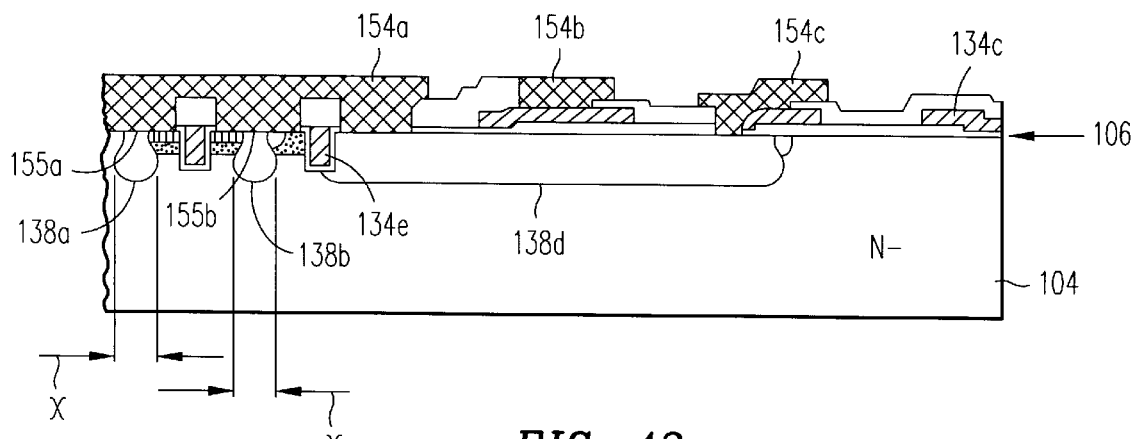

As shown in FIG. 13a, conventional interconnect metal masking steps are performed, involving covering the entire principal surface 106 with a layer of aluminum conventionally alloyed with small amounts of silicon. This aluminum layer is then conventionally patterned using a mask to define the metallization areas 154a, 154b, and 154c. These metallization areas are respectively the active (source-body) contact 154a, gate finger contact 154b, and field plate 154c.

Deep body regions 138a and 138b contact sourcebody contact 154a at contact areas 155a and 155b, respectively. Because lateral-diffusion-inhibiting regions 105 inhibit the lateral diffusion of P+ doped regions 138a and 138b, the maximum horizontal cross-sectional areas of deep body regions 138a and 138b (at "x" in FIG. 13a) are greater than their respective contact areas 155a and 155b. As shown in FIGS. 13a and 14–16, this causes deep body regions 138a and 138b to have "pear-shaped" vertical cross-sections. Of course, the figures are not drawn to scale, and the "pear" shape of deep body regions 138a and 138b may vary considerably depending on, for example, the dopant concentrations and diffusion depths of lateral-diffusion-inhibiting regions 105 and deep body regions 138a and 138b.

FIG. 13b is an enlarged view of a portion of FIG. 13a (similar to FIG. 8b) and showing the stepped oxide structure 110, 112 underlying polysilicon field plate 134b and field plate contact 154c.

Figure 14:
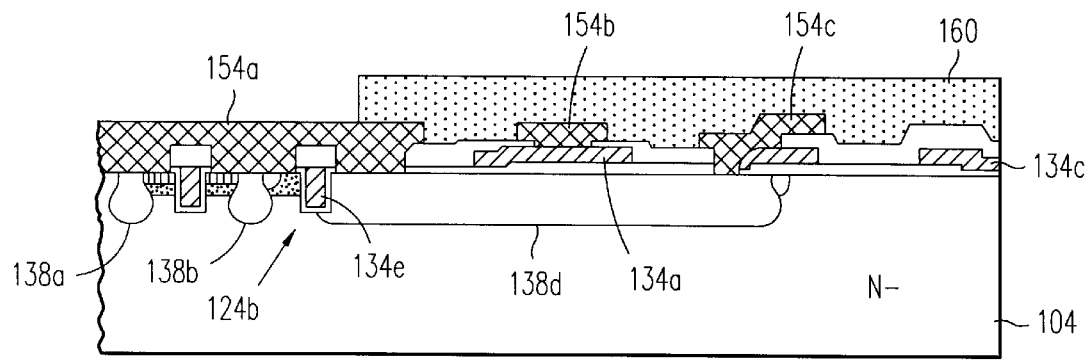

The next step is pad masking, as shown in FIG. 14. This involves surface passivation using, for instance, nitride or PSG (phosphosilicate glass) layer 160 deposited over the entire structure and then conventionally masked. Portions of layer 160 are thereafter removed as depicted in FIG. 14 to open pad areas for connection of bonding wires to the earlier formed active metallization contact 154a and to the other metallization areas as needed. (The steps described above in conjunction with FIGS. 12 to 14 are conventional.)

Figure 15:
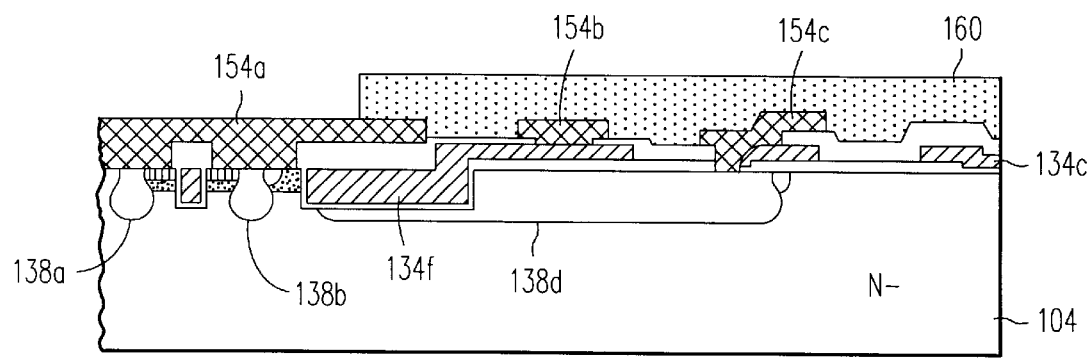

FIG. 15 is a cross section depicting many of the same structures as shown in FIG. 14 but at a different portion of a cell, thus better illustrating the polysilicon gate runner connection 134f in the central portion of the figure. Gate runner connection 134f is typically located at the die perimeter. The gate runner 134f conventionally electrically is connected to all of the gates. At the location of gate runner 134f, the cross section of FIG. 15 is along an "L shape" (dog leg) in plan view (not shown) to better illustrate the gate runner 134f along a length of its trench.

Figure 16:
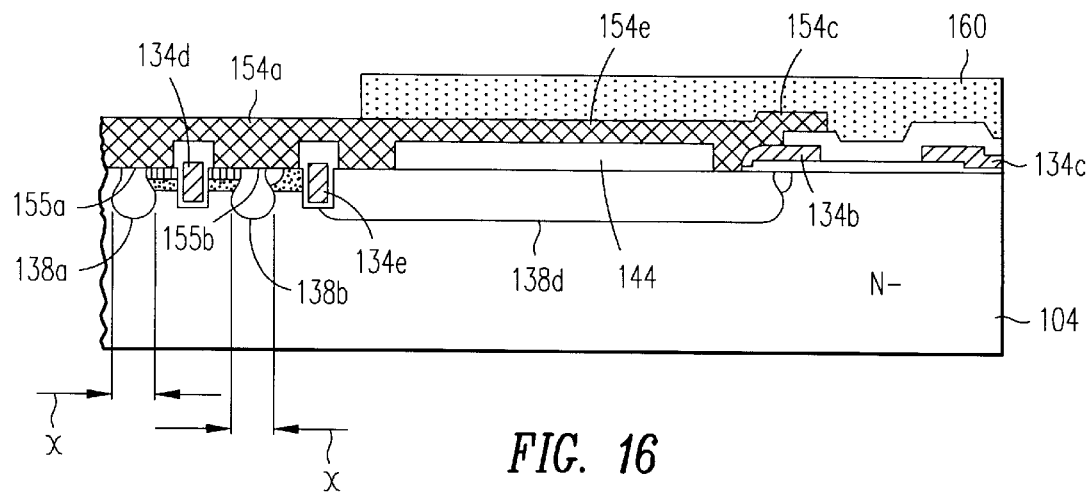

FIG. 16 illustrates an additional cross section showing other portions of the termination. In this case the field plate 154c, which is a termination conductive structure conventionally provided for power transistors, connects to the source-body region metal contact 154a by a metal crossover 154e that crosses over the BPSG insulating layer 144 in the termination region to the field plate contact 154c and the field plate 134b.

Also in accordance with the invention, each cell next to a gate finger is a dummy (nonactive due to having no channel) cell. Thus the entire cell row (e.g. 134e in FIG. 14 adjacent to a gate finger 134a) consists of dummy cells. This structure is achieved by the same mask as the blocking implant mask 142 in FIG. 10a so that no N+ source implant is made adjacent polysilicon trench filling 134e. Thus the dummy cells are implemented by providing the doped regions immediately to the right of trench 124b as having no active regions and hence serving as portions of a dummy cell. The dummy cells have been found to improve reliability and device ruggedness. These dummy cells are dispensed with in other embodiments.

The above description is illustrative and not limiting; for instance the same steps may be used with the conductivity types of the various semiconductor regions reversed to form a transistor in accordance with the invention. Other modifications will be apparent to those of ordinary skill in the art in the light of this disclosure and are intended to fall within the scope of the appended claims.

We claim:

1. A method of forming a transistor cell, the method comprising:

providing a semiconductor substrate having an epitaxial layer of a first conductivity type having a substantially planar upper surface, said epitaxial layer extending from a principal surface of the substrate to said substantially planar upper surface;

forming a first oxide layer over said substantially planar upper surface of the epitaxial layer;

patterning the first oxide layer to define a deep-body area in the substantially planar upper surface;

forming a diffusion-inhibiting region of the first conductivity type in the deep-body area, the substantially planar upper surface extending beyond the periphery of the diffusion-inhibiting region at said periphery;

forming a second oxide layer over the patterned first oxide layer and the deep-body area;

removing part of the second oxide layer to expose a center portion of the deep-body area and to leave oxide sidewall spacers and the patterned first oxide layer to cover the periphery of the diffusion-inhibiting region;

introducing a dopant of a second conductivity type in the exposed deep-body area; and diffusing the introduced dopant, thereby to form a deep-body diffusion region of said second conductivity type, wherein the peripheral portion of the diffusion-inhibiting region inhibits lateral diffusion of the deep-body diffusion region, beyond the periphery of the diffusion-inhibiting region at the substantially planar upper surface.

2. The method of claim 1, wherein the removing the second oxide layer is followed by the step of etching the exposed center portion of the deep-body area.

3. The method of claim 2, wherein the etching is performed using a dry etch.

4. The method of claim 1, further comprising:

forming at least two trenches in the epitaxial layer, the trenches intersecting to define a corner of the cell;

forming an insulating layer lining the trenches;

forming a conductive electrode in the trenches overlying the insulating layer;

forming a body region in the epitaxial layer having the second conductivity type, the body region extending into the epitaxial layer alongside the at least two trenches;

forming a masking layer over the epitaxial layer and covering the epitaxial layer at the corner; and forming a source region of the first conductivity type and extending into the epitaxial layer from the principal surface alongside the at least two trenches, an extent of the source region being defined by the masking layer, the source region thereby being spaced apart from the corner.

5. The method of claim 1, wherein the forming the diffusion-inhibiting region comprises implanting ions in the epitaxial layer.

6. The method of claim 1, wherein the forming the diffusion-inhibiting region comprises pre-depositing dopant in the epitaxial layer.

7. The method of Claim 4, further comprising, after the forming the trenches:

growing a layer of oxide on the sidewalls of the trenches; and stripping off the layer of oxide, thereby smoothing the sidewalls and rounding off the bottom portion of the trenches.

8. The method of claim 4, further comprising, before the forming the insulating layer, isotropically dry etching the sidewalls of the trenches, thereby smoothing the sidewalls and rounding off the top and bottom portion of the trenches.

9. The method of claim 1, further comprising forming an additional body region of the second conductivity type in the epitaxial layer and extending into the epitaxial layer to a depth different than that of the deep body region.

10. The method of claim 4, wherein the forming a masking layer comprises defining a rectangular mask portion at each corner of the cell.

11. The method of claim 4, further comprising determining an area of a portion of the masking layer covering the epitaxial layer at the corner as being dependent on a width of the trenches and process alignment techniques.

12. The method of claim 4, wherein the forming the insulating layer comprises:

growing a layer of oxide on the sidewalls of the trenches; and stripping off the layer of oxide, thereby smoothing the sidewalls and rounding off the bottom portion of the trenches.

13. A method of forming a transistor cell, the method comprising:

providing a semiconductor substrate having an epitaxial layer of a first conductivity type extending from a principal surface of the substrate;

forming a first oxide layer over the epitaxial layer;

patterning the first oxide layer to define a deep-body area;

forming a diffusion-inhibiting region of the first conductivity type in the deep-body area;

forming a second oxide layer over the patterned first oxide layer and the deep-body area;

removing part of the second oxide layer to expose a center portion of the deep-body area and to leave oxide sidewall spacers and the patterned first oxide layer to cover the periphery of the diffusion-inhibiting region;

introducing a dopant of a second conductivity type in the exposed deep-body area;

diffusing the introduced dopant, thereby to form a deep-body diffusion region, wherein the periphery of the diffusion-inhibiting region inhibits lateral diffusion of the deep-body diffusion region;

forming at least two trenches in the epitaxial layer, the trenches intersecting to define a corner of the cell;

forming an insulating layer lining the trenches;

forming a conductive electrode in the trenches overlying the insulating layer;

forming a shallow body region in the epitaxial layer having the second conductivity type, the shallow body region extending into the epitaxial layer alongside the at least two trenches;

forming a masking layer over the epitaxial layer and covering the epitaxial layer at the corner; and forming a source region of the first conductivity type and extending into the epitaxial layer from the principal surface alongside the at least two trenches, an extent of the source region being defined by the masking layer, the source region thereby being spaced apart from the corner.

14. The method of claim 13, wherein the removing the second oxide layer is followed by the step of etching the exposed center portion of the deep-body area.

15. The method of claim 1, further comprising:

completely removing the second oxide layer between the sidewall spacers in the center portion of the deep-body area.

16. The method of claim 4, further comprising:

completely removing the second oxide layer between the sidewall spacers in the center portion of said deep-body area.

17. The method of claim 13, further comprising:

completely removing the second oxide layer between the sidewall spacers in the center portion of said deep-body area.

18. The method of claim 1, further comprising:

diffusing the diffusion-inhibiting region until it extends outwardly significantly beyond the sidewall spacers.

19. The method of claim 4, further comprising:

diffusing the diffusion-inhibiting region until it extends outwardly significantly beyond the sidewall spacers.

20. The method of claim 13, further comprising:

diffusing the diffusion-inhibiting region until it extends outwardly significantly beyond the sidewall spacers.

21. The method of claim 1, further comprising:

in the diffusing the introduced dopant, diffusing the introduced dopant to form a narrower extent at the substantially planar surface of said exit axially layer than at a deeper portion removed from the substantially planar surface, to thereby form a pear-shaped diffusion region.

22. The method of claim 4, further comprising:

in the diffusing the introduced dopant, diffusing the introduced dopant to form a narrower extent at the substantially planar surface of said exit axially layer than at a deeper portion removed from the substantially planar surface, to thereby form a pear-shaped diffusion region.

23. The method of claim 13, further comprising:

in the diffusing the introduced dopant, diffusing the introduced dopant to form a narrower extent at the substantially planar surface of the exit axially layer than at a deeper portion removed from the substantially planar surface, to thereby form a pear-shaped diffusion region.

24. The method of claim 1, wherein the removing the second oxide layer is followed by anisotropically etching the exposed center portion of the deep-body area such that part of the epitaxial layer is also etched away, forming a surface of the epitaxial layer beneath the substantially planar upper surface.

25. The method of claim 4, wherein the removing the second oxide layer is followed by anisotropically etching the exposed center portion of the deep-body area such that part of said epitaxial layer is also etched away, forming a surface of the epitaxial layer beneath said substantially planar upper surface.

26. The method of claim 13, wherein the removing the second oxide layer is followed by anisotropically etching the exposed center portion of the deep-body area such that part of the epitaxial layer is also etched away, forming a surface of the epitaxial layer beneath the surrounding upper portions of said epitaxial layer.

27. The method of claim 1, further comprising forming a contact to the deep-body diffusion region and said diffuser-inhibiting region.

28. The method of claim 4, further comprising forming a contact to the deep-body diffusion region and said diffusion-inhibiting region.

29. The method of claim 13, further comprising forming a contact to the deep-body diffusion region and said diffusion-inhibiting region.

30. The method of claim 4, further comprising forming a contact to the source region.

31. The method of claim 13, further comprising forming a contact to said source region.

32. The method of claim 9, further comprising forming a contact to the additional body region.

33. The method of claim 28, further comprising forming a contact to the conductive electrode.

34. The method of claim 29, further comprising forming a contact to the conductive electrode.

35. The method of claim 30, further comprising forming a contact to the conductive electrode.

36. The method of claim 31, further comprising forming a contact to the conductive electrode.

37. A method of forming a transistor cell, the method comprising the steps of:

provifing a semiconductor substrate having an epitaxial layer of a first conductivity type extending from a principal surface of the substrate;

forming a first oxide layer over the epitaxial layer;

patterning the first oxide layer to define a deep-body area;

forming a diffusion-inhibiting region of the first conductivity type in the deep-body area;

forming a second oxide layer over the patterned first oxide layer and the deep-body area;

removing part of the second oxide layer to expose a center portion of the deep-body area and to leave oxide sidewall spacers and the patterned first oxide layer to cover the periphery of the diffusion-inhibiting region;

introducing a dopant of a second conductivity type in the exposed deep-body area;

diffusing the introduced dopant, thereby to form a deep-body diffusion region, wherein the periphery of the diffusion-inhibiting region inhibits lateral diffusion of the deep-body diffusion region;

forming at least two trenches in the epitaxial layer, the trenches intersecting to define a corner of the cell;

forming an insulating layer lining the trenches;

forming a conductive electrode in the trenches overlying the insulating layer;

forming a body region in the epitaxial layer having the second conductivity type, the body region extending into the epitaxial layer alongside the at least two trenches;

forming a masking layer over the epitaxial layer and covering the epitaxial layer at the corner; and forming a source region of the first conductivity type and extending into the epitaxial layer from the principal surface alongside the at least two trenches, an extent of the source region being defined by the masking layer, the source region thereby being spaced apart from the corner.

* * * * *

UNITED STATES PATENT AND TRADEMARK OFFICE
CERTIFICATE OF CORRECTION

PATENT NO. : 5,904,525  
DATED : May 18, 1999  
INVENTOR(S) : Fwu-Iuan Hshieh et al.

Page 1 of 1

It is certified that error appears in the above-identified patent and that said Letters Patent is hereby corrected as shown below:

<u>Column 8,</u>  
Line 1, delete "laver" and substitute -- layer --.

Signed and Sealed this

Thirtieth Day of April, 2002

*Attest:*

*Attesting Officer*

JAMES E. ROGAN  
*Director of the United States Patent and Trademark Office*